United States Patent [19]

Ishigaki et al.

[11] 4,163,945

[45] Aug. 7, 1979

[54] SYSTEM FOR REMOVING INTERFERENCE DISTORTION IN THE DEMODULATED SIGNAL OF A FREQUENCY-MODULATED SIGNAL

[75] Inventors: Yukinobu Ishigaki, Yamato; Teruo Muraoka, Yokohama, both of Japan

[73] Assignee: Victor Company of Japan, Ltd., Yokohama, Japan

[21] Appl. No.: 915,212

[22] Filed: Jun. 13, 1978

[30] Foreign Application Priority Data

Jun. 14, 1977 [JP]  Japan ................................ 52-70255

[51] Int. Cl.$^2$ ............................................ H04B 1/10
[52] U.S. Cl. ...................................... 325/473; 325/65
[58] Field of Search ................ 325/473, 474, 475, 476, 325/479, 377, 65; 358/905

[56] References Cited

U.S. PATENT DOCUMENTS

| | | | |
|---|---|---|---|
| 3,351,859 | 11/1967 | Groth et al. ............................ | 325/65 |
| 3,466,547 | 9/1969 | Flanagan et al. ...................... | 325/65 |
| 3,537,008 | 10/1970 | Lakatos ................................. | 325/474 |

Primary Examiner—Douglas W. Olms
Attorney, Agent, or Firm—Haseltine, Lake & Waters

[57] ABSTRACT

A system for removing interference distortion in the demodulated signal of a frequency-modulated signal comprises a demodulator for demodulating an input frequency-modulated signal Ca(t) which has been subjected to interference by another frequency-modulated signal, and thereby obtaining a demodulated signal $e_o(t)$, a first analog multiplier for obtaining a signal in which the input frequency-modulated signal is squared, a low-pass filter supplied with the squared signal and detecting an envelope of the input frequency-modulated signal in square characteristics, and thereby producing as output a squared envelope signal $\{Env(t)\}^2$, a second analog multiplier supplied with the demodulated signal $e_o(t)$ from the demodulator and with the squared envelope signal $\{Env(t)\}^2$ from the low-pass filter, and thereby producing as output a signal $e_{oa}(t)$ of the product of both signals, a DC blocking capacitor for suppressing DC component of said squared envelope signal $\{Env(t)\}^2$, and thereby obtaining only AC component, a first operation circuit supplied with the product signal $e_{oa}(t)$, a delay circuit for delaying an output signal of the first operation circuit by a specific delay time, a second operation circuit for adding the output signal of the first operation circuit and the output signal of the second operation circuit, and a third analog multiplier for carrying out multiplication of the AC component signal $\{Env(t)\}^2$ and the output signal of the second operation circuit, and thereby supplying the resulting output signal $h(t)$ to the first operation circuit. The first operation circuit substantially carries out subtraction of the signal $e_{oa}(t)$ and the signal $h(t)$. From the first operation circuit is derived the demodulated signal in which the interference distortion has been substantially cancelled and thus removed.

6 Claims, 2 Drawing Figures

SYSTEM FOR REMOVING INTERFERENCE DISTORTION IN THE DEMODULATED SIGNAL OF A FREQUENCY-MODULATED SIGNAL

BACKGROUND OF THE INVENTION

The present invention relates generally to systems of removing interference distortion such as multipath distortion contained in signals obtained by demodulating frequency-modulated signals. More particularly, the invention relates to a system wherein a distortion component substantially equal to an interference distortion contained in a signal obtained by demodulating a frequency-modulated signal is formed and used to cancel and remove the interference distortion.

In general, when a plurality of frequency-modulated signals (hereinafter referred to as FM signals) interfere with each other, interference distortion is produced. This phenomenon occurs in cases such as that, for example, wherein FM signals which have passed through a plurality of propagation paths (multipaths) interfere with each other, and this interference distortion is called multipath distortion. For example, in the case where an FM broadcast wave is directly received at the antenna of an FM receiver and, at the same time, is received after being reflected or diffracted by objects such as buildings, the FM signals thus received after passing through multipaths in this manner interfere with each other and give rise to interference distortion in the demodulated signal.

In order to reduce the generation of multipath distortion of this character, it has been a practice in known FM receivers to use antennas of sharp directional characteristic by which only directly arriving FM signals can be readily received, while FM signals arriving after being reflected or diffracted are not easily received. However, the occurrence of multipath distortion cannot be fully reduced by merely relying on only the directional characteristic of the antenna.

Accordingly, a method wherein a signal approximating the interference distortion component is formed by an electrical circuit within the FM receiver and used to cancel the distortion component in the demodulated signal has been tried. In this known method, however, the degree of approximation of the signal caused to approximate the distortion for the purpose of canceling the distortion component is very rough. For this reason, the signal components of the signal for distortion cancellation and the actual distortion component, strictly speaking, are considerably far apart, whereby distortion cancellation cannot be satisfactorily carried out, and, even 111 133 strictly after the distortion cancellation operation, a substantial distortion component remains.

In this connection, mutual interference of FM signals is not limited to only FM broadcasting but occurs in other instances such as the case of recording and reproducing of an FM signal on and from a recording medium and the case where there is mismatching between a cable for transmitting an FM signal and the related input and output equipments.

SUMMARY OF THE INVENTION

Accordingly, it is a general object of the present invention to provide a novel and useful system for removing interference distortion in the demodulated signal of an FM signal in which system the above desired difficulties and problems are overcome.

Another and specific object of the invention is to provide an interference distortion removing system in which a signal for distortion cancellation which is substantially equal to the interference distortion in a demodulated signal of an FM signl is formed and used to cancel the distortion component. According to the system of the present invention, interference distortion can be removed to be non substantially.

Other objects and further features of the invention will be apparent from the following detailed description with respect to preferred embodiments of the invention when read in conjunction with the accompanying drawings.

DETAILED DESCRIPTION

Figure 1:
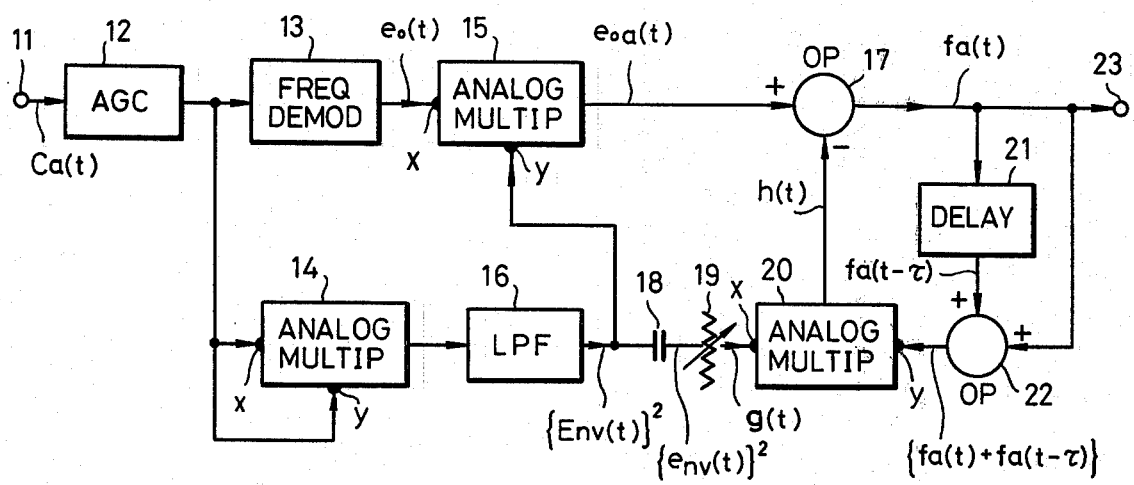
FIG. 1 is a block schematic diagram of one embodiment of the interference distortion removing system according to the invention.

Referring to a block schematic diagram in FIG. 1, a frequency-modulated (FM) signal $C_a(t)$ applied to an input signal 11 is respectively supplied, through an automatic gain control circuit (AGC circuit) 12, to a frequency demodulator 13, and to the x input terminal and the y input terminal of an analog multiplier 14.

In the case where there is an interference distortion, the input FM signal $C_a(t)$ is a combined wave of the original FM signal $C(t)$ without distortion and an FM signal $C(t-\tau)$ wherein this signal $C(t)$ has a time delay of $\tau$. Then, these FM signals can be respectively expressed by the following equations in terms of the modulating signal $f(t)$, the carrier wave $\omega_c t$, and the interference ratio $K$ of the FM signal $C(t)$ and the FM signal $C(t-\tau)$.

$$C(t) = \cos\{\omega_c t + f(t)\} \tag{1}$$

$$C(t-\tau) = \cos\{\omega_c t + f(t-\tau) - \omega_c \tau\} \tag{2}$$

$$\begin{aligned}C_a(t) &= C(t) + C(t-\tau) = \cos\{\omega_c t + f(t)\} + K\cos\{\omega_c t + f(t-\tau) - \omega_c \tau\} \\ &= \sqrt{1 + K^2 + 2K\cos\{f(t) - f(t-\tau) + \omega_c \tau\}} \\ &\quad \times \cos\left[\omega_c t f(t) - \tan^{-1}\frac{K\sin\{f(t) - f(t-\tau) + \omega_c \tau\}}{1 + K\cos\{f(t) - f(t-\tau) + \omega_c \tau\}}\right]\end{aligned} \tag{3}$$

When the FM signal $C_a(t)$ expressed by the above given Eq. (3) is demodulated by the frequency demodulator 13, a demodulated signal $e_0(t)$ expressed by the following equation is obtained.

$$e_o(t) = \frac{f_a(t) + K^2 f_a(t-\tau) + K\{f_a(t) + f_a(t-\tau)\}\cos\{f(t) - f(t-\tau) + \omega_c \tau\}}{1 + K^2 + 2K\cos\{f(t) - f(t-\tau) + \omega_c \tau\}} \tag{4}$$

In this Eq. (4), the demodulated signal components having no relationship with interference distortion is a part only represented by $fa(t)+K^2fa(t-\tau)$, while the other signal components is distortion. The demodulated signal $e_o(t)$ of the Eq. (4) is supplied from the frequency demodulator 13 to the x input terminal of an analog multiplier 15.

On the other hand, the FM signal Ca(t) supplied to the x and y input terminals of the analog multiplier 14 from the AGC circuit 12, as described hereinbefore, has an amplitude fluctuation in a state where amplitude fluctuations of frequencies lower than the lower-limit frequency of audible frequency band have been removed or eliminated by the AGC circuit 12. From the analog multiplier 14 is derived a signal in which the signal supplied thereto is multiplied by itself, or squared.

The output signal of the analog multiplier 14 is supplied to a low-pass filter 16 where its carrier component is eliminated. The low-pass filter 16 produces an envelope signal $\{Env(t)\}^2$ in which an envelope $Env(t)$ of amplitude fluctuation in the FM signal Ca(t) has been squared. The output signal of the low-pass filter 16 is partly supplied to the y input terminal of the analog multiplier 15.

The envelope $Env(t)$ of the amplitude fluctuation in the FM signal Ca(t) is expressed, in the above given Eq. (3) representing the FM signal Ca(t), by the following equation.

$$\sqrt{1+K^2+2K\cos\{f(t)-f(t-\tau)+\omega c\tau\}} \tag{3a}$$

Accordingly, the envelope signal $\{Env(t)\}^2$, in which the envelope $Env(t)$ of the amplitude fluctuation in the FM signal Ca(t) has been squared, is expressed by the following equation.

$$\{Env(t)\}^2=1+K^2+2K\cos\{f(t)-f(t-\tau)+\omega c\tau\} \tag{5}$$

When this envelope signal expressed by this Eq. (5) and the demodulated signal $e_o(t)$ which is led out from the frequency demodulator 13 and is indicated by the Eq. (4) are compared, it may be understood that the envelope signal expressed by Eq. (5) is the same as the denominator in the right-hand side of Eq. (4) which expresses the demodulated signal.

Accordingly, when the demodulated signal $e_o(t)$ applied to the x input terminal of the analog multiplier 15 and the envelope signal $\{Env(t)\}^2$ applied to the y input terminal thereof is subjected to multiplication in the analog multiplier 15, from which an output signal $e_{oa}(t)$ expressed by the following equation is derived.

$$e_{oa}(t)=fa(t)+K^2fa(t-\tau)+K\{fa(t)+fa(t-\tau)\}\times\cos\{f(t)-f(t-\tau)+\omega c\tau\} \tag{6}$$

This output signal $e_{oa}(t)$ is supplied as a minuend signal to an operation circuit 17 constituting a subtraction circuit.

The output envelope signal $\{Env(t)\}^2$ of the low-pass filter 16 is partly passed through a capacitor 18 for suppressing DC component, by which its DC component is removed, and thus becomes the signal $\{env(t)\}^2$ expressed by the following equation.

$$\{env(t)\}^2=2K\cos\{f(t)-f(t-\tau)+\omega c\tau\} \tag{7}$$

This signal $\{env(t)\}^2$ is adjusted its amplitude by a variable resistor attenuator 19, and thus becomes the signal g(t) expressed by the following equation.

$$g(t)=K\cos\{f(t)-f(t-\tau)+\omega c\tau\} \tag{8}$$

This signal g(t) is supplied to the x input terminal of an analog multiplier 20.

On the other hand, the output signal fa(t) of the operation circuit 17 is supplied to a delay circuit 21 and also to an operation circuit 22 constituting an adding circuit. The signal fa(t) supplied to the delay circuit 21 is delayed by the time $\tau$ thereby to be a signal $fa(t-\tau)$, and is then supplied to the operation circuit 22. The operation circuit 22 carries out addition of two input signals fa(t) and $fa(t-\tau)$ and thereby produces as output a signal expressed by $\{fa(t)+fa(t-\tau)\}$, which is supplied to the y input terminal of the analog multiplier 20. The analog multiplier 20 thereupon carries out multiplication of the signal g(t) supplied to the x input terminal thereof and the signal $\{fa(t)+fa(t-\tau)\}$ supplied to the y input terminal thereof. The analog multiplier 20 thereby produces as output a signal h(t) given by the following equation and supplies this signal as a subtrahend signal to the operation circuit 17.

$$h(t)=K\{fa(t)+fa(t-\tau)\}\cos\{f(t)-f(t-\tau)+\omega c\tau\} \tag{9}$$

The operation circuit 17 carries out subtraction of the signal $e_{oa}(t)$ expressed by Eq. (6) and supplied from the analog multiplier 15, and the signal h(t) expressed by Eq. (9) and supplied from the analog multiplier 20. The operation circuit 17 thereby produces as output a signal given by the following equation.

$$e_{oa}(t)-h(t)=fa(t)+K^2fa(t\tau) \tag{10}$$

Here, since the interference ratio K is less than 1 (unity), in actual practice, the quantity of the second term in the right-hand side of Eq. (10), that is, the quantity $K^2fa(t-\tau)$, is extremely small, whereby $fa>>K^2fa(t-\tau)$ is held. Accordingly, $K^2fa(t-\tau)$ is very small to the extend to be negligible and is not an interference distortion component, whereby any difficulty does not take place whatsoever even if it remains.

Therefore, an output signal fa(t) in which the interference distortion component has been cancelled and thus removed is obtained from the operation circuit 17 and is led out through an output terminal 23.

The level of the input FM signal, in general, undergoes changes depending upon locations for receiving FM broadcasting wave. Assuming that the signal level of the FM signal Ca(t) is G, the envelope $Env(t)$ of the amplitude fluctuation of the FM signal becomes as expressed by the following equation.

$$Env(t)=G\sqrt{1+K^2+2K\cos\{f(t)-f(t-\tau)+\omega c\tau\}} \tag{11}$$

The envelope signal obtained by squaring the envelope of the amplitude fluctuation is indicated by a following equation.

$$\{Env(t)\}^2=G^2[1+K^2+2K\cos\{f(t)-f(t-\tau)+\omega c\tau\}] \tag{12}$$

When the level G of the FM signal changes, the envelope signal produced based on the detection value in square characteristics of the envelope of the amplitude fluctuation in FM signal undergoes change over a large extent, which thereby arises difficulties such that the operation for removing interference distortion in the demodulated signal is not performed preferably, and further, that the distortion factor is rather deteriorated. However, the difficulties raised due to change in level G of the FM signal may be eliminated if the parameter G in the above given Eqs. (11) and (12) is 1 (unity). In view of this, the system of the present invention is so arranged that the signal level of the FM signal Ca(t) becomes constant by the AGC circuit 12, whereby the condition of G=1 is fully satisfied.

Moreover, when the FM broadcasting wave is received, an indefinite number of reflected waves are received. However, the difficulties due to the reflected waves are greatly reduced, when the value of the delay time of the delay circuit 21 is selected to be equal to the time difference between the reflected radio wave of maximum level among the reflected waves and the directly-received wave.

Figure 2:
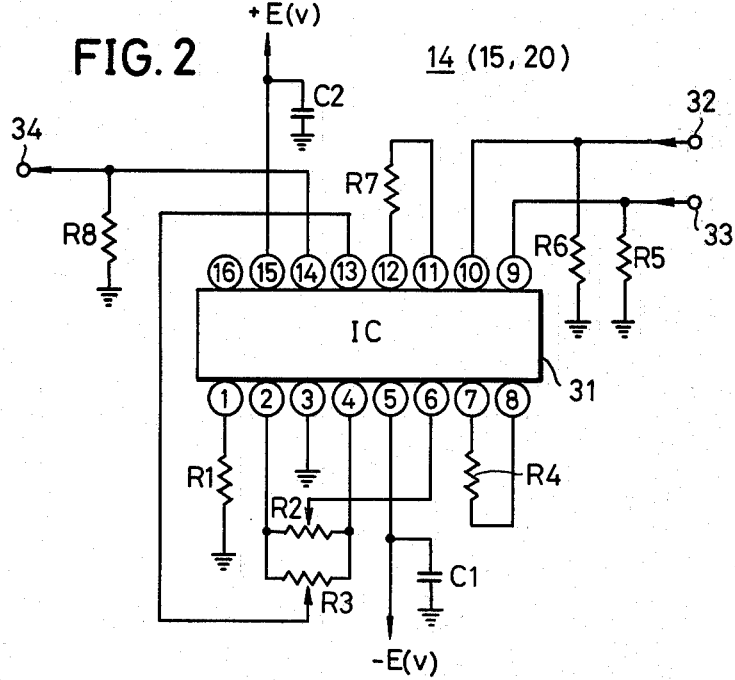
FIG. 2 is a circuit diagram of one example of the analog multiplier in the system shown in FIG. 1.

Next, a circuit of one example of the above described analog multiplier 14 (15 or 20) is indicated in FIG. 2. The analog multiplier 14 comprises an integrated circuit 31 specified by 1494L or 1594L, resistors R1 through R8, and capacitors C1 and C2. The x input terminal 32 and the y input terminal 33 are respectively connected to tenth pin and ninth pin of the integrated circuit 31. From an output terminal 34 connected to 14th pin of the integrated circuit 31, there is derived an output signal kXY, which is obtained by multiplying the input signals X, Y to the input terminals 32 and 33 by a certain constant k corresponding to the gain of the multiplier 14. One example of constants of respective circuit elements are indicated as follows. Resistors

| R1 | 16 KΩ | R2 | 20 kΩ |
|----|-------|----|-------|
| R3 | 30 "  | R4 | 6.2 " |
| R5 | 3.3 " | R6 | 3.3 " |
| R7 | 3 "   | R8 | 3.9 " |
| Capacitors | | | |
| C1 | 0.022 μF | C2 | 0.022 μF |

Further, this invention is not limited to these embodiments but various variations and modifications may be made without departing from the scope of the invention.

What is claimed is:

1. A system for removing interference distortion in the demodulated signal of a frequency-modulated signal comprising:
   means for demodulating an input frequency-modulated signal Ca(t) which has been subjected to interference by another frequency-modulated signal, and thereby obtaining a demodulated signal $e_o(t)$;
   squaring means for obtaining a signal in which said input frequency-modulated signal is squared;
   means supplied with said squared signal and detecting an envelope of said input frequency-modulated signal in square characteristics, and thereby producing as output a squared envelope signal $\{Env(t)\}^2$;
   means supplied with the demodulated signal $e_o(t)$ from said demodulating means and with the squared envelope signal $\{Env(t)\}^2$ from said producing means, and thereby producing as output a signal $e_{oa}(t)$ of the product of both signals;
   means for suppressing DC component of said squared envelope signal $\{Env(t)\}^2$, and thereby obtaining only AC component;
   first operation means supplied with said product signal $e_{oa}(t)$;
   delay means for delaying an output signal of said first operation means by a specific delay time;
   second operation means for adding the output signal of said first operation means and the output signal of said delay means;
   means for carrying out multiplication of said AC component signal $\{env(t)\}^2$ and the output signal of said second operation means, and thereby supplying the resulting output signal h(t) to said first operation means, said first operation means being substantially carrying out subtraction of said signal $e_{oa}(t)$ and said signal h(t); and
   means for obtaining from said first operation means as a demodulated signal in which the interference distortion has been substantially cancelled and thus removed.

2. A system for removing interference distortion as claimed in claim 1 which further comprises automatic gain control means supplied with said input frequency-modulated signal and supplying an output signal thereof to said demodulating means and said squaring means.

3. A system for removing interference distortion as claimed in claim 1 in which said squaring means comprises an analog multiplier having the x input terminal and the y input terminal respectively supplied with said input frequency-modulated signal.

4. A system for removing interference distortion as claimed in claim 1 in which: said means for obtaining the squared envelope signal comprises a low-pass filter means for removing a carrier component from the output signal of said squaring means.

5. A system for removing interference distortion as claimed in claim 1 which further comprises means for adjusting amplitude of said AC signal $\{env(t)\}^2$.

6. A system for removing interference distortion in the demodulated signal of a frequency-modulated signal comprising:
   automatic gain control means supplied with an input frequency-modulated signal Ca(t) which has been subjected to interference by another frequency-modulated signal;
   means supplied with an output of said automatic gain control means, thereby carrying out demodulation and obtaining the resulting demodulated signal $e_o(t)$;
   a first analog multiplier having the x input terminal and the y input terminal respectively supplied with the output of said automatic gain control means, and producing as output the resulting squared signal;
   low-pass filter means for removing carrier component from the output signal of said first analog multiplier, thereby obtaining a squared envelope signal $\{Env(t)\}^2$;
   a second analog multiplier supplied with the demodulated signal $e_o(t)$ from said demodulated means and with the squared envelope signal $\{Env(t)\}^2$ from said low-pass filter means, thereby carrying out multiplication of both signals and producing as output a signal $e_{oa}(t)$;
   a DC blocking capacitor for suppressing DC component among the squared envelope signal $\{Env(t)\}^2$ from said low-pass filter means, thereby obtaining only AC component signal $\{env(t)\}^2$ thereof;

means for adjusting amplitude of said AC component signal $\{env(t)\}^2$, and thereby obtaining a signal g(t);

first operation means supplied with the output signal $e_{oa}(t)$ of said second analog multiplier and producing as output a signal fa(t);

delay means for delaying the output signal of said first operation circuit, and thereby obtaining a signal $fa(t-\tau)$;

second operation means for carrying out addition of the output signal of said first operation means and the output signal of said delay means, and thereby obtaining a signal $\{fa(t)+fa(t-\tau)\}$;

means for carrying out multiplication of said signal g(t) and the output signal of said second operation means, and thereby supplying the resulting output signal h(t) to said first operation means, said first operation means being substantially carrying out subtraction of said signal $e_{oa}(t)$ and said signal h(t); and means for obtaining from said first operation means as output a demodulated signal fa(t) in which the interference distortion has been substantially cancelled and thus removed.

* * * * *